United States Patent
Reiser et al.

(10) Patent No.: US 12,183,816 B2
(45) Date of Patent: Dec. 31, 2024

(54) TYPE III-V SEMICONDUCTOR DEVICE WITH MULTI-LAYER BARRIER REGION

(71) Applicant: Infineon Technologies Austria AG, Villach (AT)

(72) Inventors: Korbinian Reiser, Ottobrunn (DE); Ingo Daumiller, Oberaichwald (AT); Lauri Knuuttila, Villach (AT); Bhargav Pandya, Chandler, AZ (US)

(73) Assignee: Infineon Technologies Austria AG, Villach (AT)

( * ) Notice: Subject to any disclaimer, the term of this patent is extended or adjusted under 35 U.S.C. 154(b) by 693 days.

(21) Appl. No.: 17/458,827

(22) Filed: Aug. 27, 2021

(65) Prior Publication Data

US 2023/0067452 A1  Mar. 2, 2023

(51) Int. Cl.
| | |
|---|---|
| *H01L 29/66* | (2006.01) |
| *H01L 29/10* | (2006.01) |
| *H01L 29/205* | (2006.01) |
| *H01L 29/778* | (2006.01) |
| *H01L 29/20* | (2006.01) |

(52) U.S. Cl.
CPC ...... *H01L 29/7786* (2013.01); *H01L 29/1029* (2013.01); *H01L 29/205* (2013.01); *H01L 29/66462* (2013.01); *H01L 29/7787* (2013.01); *H01L 29/2003* (2013.01)

(58) Field of Classification Search
None
See application file for complete search history.

(56) References Cited

U.S. PATENT DOCUMENTS

| | | | |
|---|---|---|---|
| 9,741,840 B1 * | 8/2017 | Moens | H01L 21/8252 |
| 10,153,362 B2 | 12/2018 | Curatola et al. | |
| 2018/0151681 A1 * | 5/2018 | Lavanga | H01L 29/205 |
| 2022/0190148 A1 * | 6/2022 | Tominari | H01L 29/045 |

* cited by examiner

*Primary Examiner* — Grant S Withers
(74) *Attorney, Agent, or Firm* — Murphy, Bilak & Homiller, PLLC (57) ABSTRACT

A semiconductor device includes a barrier region and a channel region, source and drain electrodes, and a gate structure that is configured to control a conductive connection between the source and drain electrodes, wherein the barrier region comprises a first barrier layer and a second barrier layer, wherein in a central portion of the device the second barrier layer is the only layer that is disposed over the channel region, wherein in outer lateral portions of the device the first barrier layer is disposed over the channel region, wherein the first and second barrier layers are each III-V semiconductor alloys, and wherein a molar fraction of a second type III element in the central portion is higher than a molar fraction of the second type III element in the first barrier layer.

20 Claims, 6 Drawing Sheets

TYPE III-V SEMICONDUCTOR DEVICE WITH MULTI-LAYER BARRIER REGION

TECHNICAL FIELD

The instant application relates to semiconductor devices, and particularly relates to high-electron-mobility transistor devices that are formed in type III-V semiconductor technology.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and an HEMT (high-electron-mobility Field Effect Transistor) also known as heterostructure FET (HFET) and modulation-doped FET (MODFET) are used in a variety of applications. An HEMT is formed from type III-V semiconductor material, e.g., gallium nitride (GaN), gallium arsenide (GaAs), etc. An HEMT includes a two-dimensional charge carrier gas that is created by a heterojunction between two layers of type III-V semiconductor material having different band gaps. This two-dimensional charge carrier gas provides the active device channel that accommodates the load current of the device. Due to the high mobility of carriers within the two-dimensional charge carrier gas, these devices offer very low on-resistance in comparison to other device technologies. For this reason, HEMTs are well suited for power switching applications, i.e., applications requiring the control of voltages in excess of 250V, 500V, 1000V, etc. or greater, and/or the control of current in excess of 1 A, 5 A, 10 A, etc.

It is desirable to improve the steady state conduction characteristics of an HEMT without detrimentally impacting other parameters including threshold voltage, gate current and linear region characteristics.

SUMMARY

A semiconductor device is disclosed. According to an embodiment, the semiconductor device comprises a semiconductor substrate comprising a barrier region of III-V semiconductor material and a channel region of III-V semiconductor material disposed below the barrier region, the barrier region forming a heterojunction with the channel region such that a two-dimensional charge carrier gas is disposed in the channel region near the heterojunction, source and drain electrodes that are each in ohmic contact with the two-dimensional charge carrier gas; and a gate structure that is configured to control a conductive connection between the source and drain electrodes, wherein the barrier region comprises a first barrier layer and a second barrier layer, wherein in a central portion of the semiconductor device that overlaps with the gate structure the second barrier layer is the only one of the first and second barrier layers that is disposed over the channel region, wherein in outer lateral portions of the semiconductor device that are disposed on either side of the central portion the first barrier layer is disposed over the channel region, wherein the first and second barrier layers are each III-V semiconductor alloys comprising a first type III element and a second type III element, and wherein a molar fraction of the second type III element in the central portion of the semiconductor device between the gate structure and the channel region is higher than in the first barrier layer.

Separately or in combination, the first barrier layer comprises an opening that is disposed in the central portion of the semiconductor device, and wherein the second barrier layer substantially conformally lines the opening.

Separately or in combination, the gate structure comprises a gate electrode and a region of doped III-V semiconductor material disposed between the gate electrode and the barrier region, wherein the region of doped III-V semiconductor material is configured to deplete the two-dimensional charge carrier gas in an off-state of the semiconductor device, and wherein in the central portion the second barrier layer is the only one of the first and second barrier layers that is that is disposed between the region of doped III-V semiconductor material and the channel region.

Separately or in combination, in the outer lateral portions of the semiconductor device an upper surface of the first barrier layer is exposed from the second barrier layer.

Separately or in combination, the second barrier layer directly interfaces with the channel region in the central portion of the semiconductor device.

Separately or in combination, the semiconductor device further comprises a third barrier layer that is interposed between the second barrier layer and the channel region in the central portion of the semiconductor device, wherein the third barrier layer comprises the second type III element.

Separately or in combination, a thickness of the second barrier layer is less than a thickness of the first barrier layer.

Separately or in combination, the thickness of the second barrier layer is less than one half of the thickness of the first barrier layer.

Separately or in combination, the molar fraction of the second type III element in the second barrier layer is higher than the molar fraction of the second type III element in the first barrier layer by at least two percent.

According to another embodiment, the semiconductor device comprises a semiconductor substrate comprising a barrier region of AlGaN semiconductor material and a channel region of GaN or AlGaN disposed below the barrier region, the barrier region forming a heterojunction with the channel region such that a two-dimensional charge carrier gas is disposed in the channel region near the heterojunction, source and drain electrodes that are each in ohmic contact with the two-dimensional charge carrier gas, and a gate structure that is configured to control a conductive connection between the source and drain electrodes, wherein the barrier region comprises a first barrier layer and a second barrier layer, wherein in a central portion of the semiconductor device that overlaps with the gate structure the second barrier layer is the only one of the first and second barrier layers that is disposed over the channel region, wherein in outer lateral portions of the semiconductor device that are disposed on either side of the central portion the first barrier layer is disposed over the channel region, wherein the first and second barrier layers are each layers of AlGaN, and wherein the aluminum content of the semiconductor device in the central portion of the semiconductor device between the gate structure and the channel region is higher than the aluminum content of the first barrier layer.

Separately or in combination, a thickness of the second barrier layer is less than or equal to one half of a thickness of the first barrier layer.

Separately or in combination, the aluminum content of the second barrier layer is higher than the aluminum content of the first barrier layer by at least two percent.

Separately or in combination, the aluminum content of the second barrier layer is between 15% and 40%, the aluminum content of the first barrier layer is between 5% and 25%, the thickness of the second barrier layer is between 30 nm and 5 nm, the thickness of the first barrier layer is between 100 nm and 15 nm, and the thickness of the second barrier layer is less than or equal to one half of the thickness of the first barrier layer.

Separately or in combination, the semiconductor device further comprises a third barrier layer that is interposed between the second barrier layer and the channel region in the central portion of the semiconductor device, wherein the third barrier layer is a layer of aluminum nitride.

A method of forming a semiconductor device is disclosed. According to an embodiment, the method comprises providing a semiconductor substrate comprising a barrier region of III-V semiconductor material and a channel region of III-V semiconductor material disposed below the barrier region, the barrier region forming a heterojunction with the channel region such that a two-dimensional charge carrier gas is disposed in the channel region near the heterojunction, forming a source and drain electrodes that are each in ohmic contact with the two-dimensional charge carrier gas, and forming a gate structure that is configured to control a conductive connection between the source and drain electrodes, wherein the barrier region comprises a first barrier layer and a second barrier layer, wherein in a central portion of the semiconductor device that overlaps with the gate structure the second barrier layer is the only one of the first and second barrier layers that is disposed over the channel region, wherein in outer lateral portions of the semiconductor device that are disposed on either side of the central portion the first barrier layer is disposed over the channel region, wherein the first and second barrier layers are each III-V semiconductor alloys comprising a first type III element and a second type III element, and wherein a molar fraction of the second type III element in the central portion of the semiconductor device between the gate structure and the channel region is higher than in the first barrier layer.

Separately or in combination, the method further comprises performing a first epitaxy process that forms the first barrier layer on the channel region, forming a gate trench in the first barrier layer that extends to the channel region, and performing a second epitaxy process the forms the second barrier layer on the first barrier layer and substantially conformally lines the gate trench.

Separately or in combination, the method further comprises forming gate structure comprises a gate electrode and a region of doped III-V semiconductor material disposed between the gate electrode and the barrier region, wherein the region of doped III-V semiconductor material is configured to deplete the two-dimensional charge carrier gas in an off-state of the semiconductor device, and wherein in the central portion the second barrier layer is the only one of the first and second barrier layers that is disposed between the region of doped III-V semiconductor material and the channel region.

Separately or in combination, the method further comprises forming a third barrier layer that is interposed between the second barrier layer and the channel region in the central portion of the semiconductor device, wherein the third barrier layer comprises the second type III element.

Separately or in combination, a thickness of the second barrier layer is less than one half of a thickness of the first barrier layer.

Separately or in combination, the molar fraction of the second type III element in the second barrier layer is higher than the molar fraction of the second type III element in the first barrier layer by at least two percent.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments of a high-electron mobility transistor are described herein. The high-electron mobility transistor comprises a barrier region of III-V semiconductor material (e.g., AlGaN) disposed on top of a channel region of III-V semiconductor material (e.g., GaN). The barrier region has a multi-layer configuration with a first barrier layer and a second barrier layer. The first and second barrier layers are laterally arranged such that the barrier region is disposed in a central gate region and the first barrier layer is disposed in outer lateral portions of the device. The second barrier layer has a higher molar fraction of a secondary type III element (e.g., aluminum in the case of AlGaN) than the first barrier layer). Moreover, the thickness of the second barrier layer is less than the thickness of the first barrier layer. The reduced thickness of the barrier layer and increased molar fraction of the secondary type III element in the second barrier layer produces a beneficial increase in $ID_{SAT}$ (saturation current) relative to $V_{TH}$ in comparison to a device wherein these parameters are constant throughout the barrier region. As a result, an improvement to the steady state conduction of the device is realized without detrimentally impacting the switching losses of the device.

Figure 1:
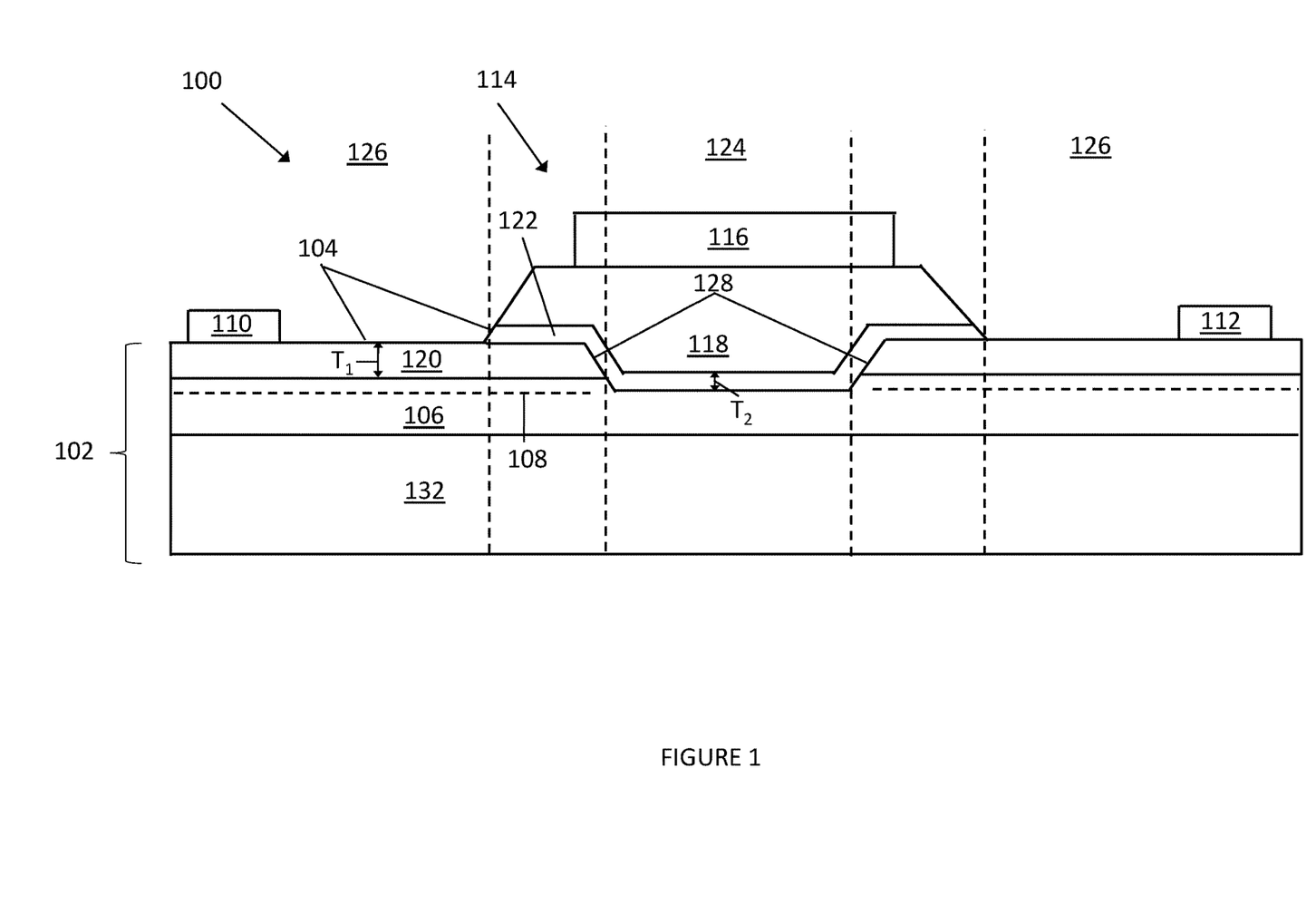
FIG. 1 illustrates a high-electron-mobility field effect transistor from a cross-sectional perspective, according to an embodiment.

Referring to FIG. 1, a high-electron mobility transistor 100 comprises a semiconductor substrate 102. The semiconductor substrate 102 comprises a barrier region 104 of III-V semiconductor material and a channel region 106 of III-V semiconductor material disposed below the barrier region 104. The barrier region 104 forms a heterojunction with the channel region 106 such that a two-dimensional charge carrier gas 108 is disposed in the channel region 106 near the heterojunction. The heterojunction and the two-dimensional charge carrier gas 108 result from a difference in bandgap between the material of the barrier region 104 and the material of the channel region 106. For instance, the channel region 106 can comprise GaN or AlGaN and the barrier region 104 can comprise AlGaN with a higher aluminum content as the channel layer. More generally, the barrier region 104 and the channel region 106 can comprise or consist of any III-V semiconductor material that is suitable for forming a heterojunction for power semiconductor devices. Exemplary III-V semiconductor materials to this end include gallium nitride (GaN), gallium arsenide (GaAs), aluminium arsenide (AlAs), indium nitride (InN), indium arsenide (InAs), etc., and ternary or quarternary III-V materials such as aluminium gallium nitride (AlGaN), aluminium gallium arsenide (AlGaAs), indium gallium nitride (InGaN), indium aluminium gallium nitride (InAlGaN), etc.

The high-electron mobility transistor 100 further comprises source and drain electrodes 110, 112 disposed on the semiconductor substrate 102. Each of the source and drain electrodes 110, 112 may comprise a conductive metal, such as tungsten or aluminum, or highly doped monocrystalline or polycrystalline semiconductors. The source and drain electrodes 110, 112 are each in ohmic contact with the two-dimensional charge carrier gas 108. This ohmic contact may arise from direct contact with the source and drain electrodes 110, 112 and the two-dimensional charge carrier gas 108 or through intermediary structures, e.g., conductive plugs, doped regions, etc. Optionally, the high-electron mobility transistor 100 may comprise a region of doped III-V semiconductor material (not shown), e.g., p-type GaN, disposed underneath the drain electrode 112. This arrangement forms a hybrid drain structure that mitigates dynamic $R_{DSON}$ (drain-source on-resistance) effects.

The high-electron mobility transistor 100 further comprises a gate structure 114 disposed on the semiconductor substrate 102 between the source and drain electrodes 110, 112. The gate structure 114 comprises a gate electrode 116 and a region of doped III-V semiconductor material 118 disposed between the gate electrode 116 and the barrier region 104. The gate electrode 116 may comprise a conductive metal, such as tungsten or aluminum, or highly doped monocrystalline or polycrystalline semiconductors. The region of doped III-V semiconductor material 118 is configured to deplete the two-dimensional charge carrier gas 108 in an off-state of the semiconductor device, e.g., at zero gate-source bias. In this way, a normally-off device configuration is obtained. For example, the region of doped III-V semiconductor may comprise p-type GaN with sufficiently high doping to create an intrinsic electric field that depletes the two-dimensional charge carrier gas 108 in the absence of gate bias. Alternatively, the gate structure 114 may be configured as a normally-on device or depletion mode device through different doping or elimination of the region of doped III-V semiconductor material 118.

The high-electron mobility transistor 100 may additionally include electrically insulating layers (not shown) on the main or upper surface of the semiconductor substrate 102. These electrically insulating layers can comprise materials such as silicon nitride, silicon dioxide, silicon oxynitride, etc., and may be configured as passivation layers and or as layers that electrically isolate the drain, source and gate electrodes 110, 112, and 116 from one another and/or from a superjacent metallization.

The working principle of the high-electron mobility transistor 100 is as follows. The gate structure 114 is configured to control a conductive connection between the source and drain electrodes 110, 112 via a channel formed by the two-dimensional charge carrier gas 108. This is done by controlling a conductive state of the two-dimensional charge carrier gas 108 in a region that is directly underneath the gate structure 114. In the case of a normally-off device, the two-dimensional charge carrier gas 108 is locally disrupted underneath the gate structure 114 without any gate bias such that the source and drain electrodes 110, 112 are disconnected from one another. This device is turned on through appropriate gate-source bias so as to repopulate the two-dimensional charge carrier gas 108 underneath the gate structure 114, thereby proving complete conductive path between the source and drain electrodes 110, 112 via the two-dimensional charge carrier gas 108. An analogous concept applies in the case of a normally-on device, except that a negative voltage is required to maintain the device in an off-state.

The high-electron mobility transistor 100 is configured such that the barrier region 104 has a multi-layer configuration. In particular, the barrier region 104 comprises a first barrier layer 120 and a second barrier layer 122. In a central portion 124 of the semiconductor device that overlaps with the gate structure 114, the second barrier layer 122 is the only one of the first and second barrier layers 120, 122 that is disposed over the channel region 106. That is, the material composition and thickness of the barrier region 104 that interacts with the channel region 106 is dictated exclusively by the second barrier layer 122 in the central portion 124. According to an embodiment, the second barrier layer 122 directly interfaces with the channel region 106 in the central portion 124 of the semiconductor device. In outer lateral portions 126 of the semiconductor device that are disposed on either side of the central portion the first barrier layer 120 is disposed over the channel region 106. In an embodiment, the first barrier layer 120 is the only one of the first and second barrier layers 120, 122 that is disposed over the channel region 106. Thus, the material composition and thickness of the barrier region 104 that interacts with the channel region 106 is dictated exclusively by the first barrier layer 120 in the outer lateral portions 126. According to an embodiment, the first barrier layer 120 directly interfaces with the channel region 106 in the outer lateral portions 126 of the semiconductor device. In another embodiment (not shown) the second barrier layer 122 may laterally extend over the first barrier layer 120 in the outer lateral portions 126.

According to an embodiment, the first barrier layer 120 comprises an opening 128 that is disposed in the central portion 124 of the semiconductor device. That is, the opening 128 corresponds to a region wherein the first barrier layer 120 has been completely removed so that the channel region 106 is uncovered from the first barrier layer 120. As shown, the second barrier layer 122 may substantially conformally line the opening 128, meaning that the second barrier layer 122 is formed along the sidewalls of the first barrier layer 120 and extends along the bottom of the opening 128 wherein the first barrier layer 120 is not present. As a result, in the central portion 124 of the semiconductor device the second barrier layer 122 is the only layer of the barrier region 104 that is disposed between the region of doped III-V semiconductor material 118 and the channel region 106.

As shown, in lateral regions of the of the semiconductor device between the central portion 124 and the outer lateral portions 126, the second barrier layer 122 may be disposed on an upper surface of the first barrier layer 120. That is, in an outer part of the gate structure 114, the first and second barrier layers 120 and 122 are overlapping. In the outer lateral portions 126 that are outside of these lateral regions, the upper surface of the first barrier layer 120 is exposed from the second barrier layer 122

According to an embodiment, the thickness $T_2$ of the second barrier layer 122 is less than the thickness $T_1$ of the first barrier layer 120. Generally speaking, the thickness $T_2$ of the second barrier layer 122 may be between 30 nm and 10 nm, and the thickness $T_1$ of the first barrier layer 120 may be between 200 nm and 30 nm wherein $T_1 > T_2$. In one particular example, the thickness $T_2$ of the second barrier layer 122 is less than or equal to ⅓ of the thickness $T_2$ of the first barrier layer 120. For example, the thickness $T_2$ of the second barrier layer 122 may be between 30 nm and 10 nm, and the thickness of the of the first barrier layer 120 may be between 200 nm and 30 nm, wherein $T_1 \geq 3T_2$. The thickness $T_2$ of the second barrier layer 122 refers to a shortest distance between a lower surface of the second barrier layer 122 which faces the channel region 106 in the central region 124 and an upper surface of the second barrier layer 122 opposite from this lower surface of the second barrier layer 122. The thickness $T_1$ of the first barrier layer 120 refers to a shortest distance between a lower surface of the first barrier layer 120 which faces the channel region 106 in the outer later region 126 and an upper surface of the first barrier layer 120 opposite from this lower surface of the first barrier layer 120.

According to an embodiment, the first and second barrier layers 120, 122 are each III-V semiconductor alloys comprising a first type III element and a second type III element. The first type III element may be the type III element which has the highest concentration in the material, and the second type III element may be the type III element which has the second highest concentration in the material. The concentration of the second type III element may be used to create the bandgap difference between the barrier region 104 and the channel region 106, which may have a lower concentration of the second type III element or may be devoid of the second type III element altogether. For example, the first and second barrier layers 120, 122 may each be layers of AlGaN, wherein the first type III element is gallium and wherein the second type III element is aluminum. More generally, the first and second barrier layers 120, 122 may comprise ternary or quarternary III-V materials comprising at least two type III elements such as aluminium gallium arsenide (AlGaAs), indium gallium nitride (InGaN), indium aluminium gallium nitride (InAlGaN), etc.

According to an embodiment, a molar fraction of the second type III element in the second barrier layer 122 is higher than a molar fraction of the second type III element in the first barrier layer 120. The molar fraction of the secondary type III material refers to ratio between the molar mass of the secondary type III material relative to the overall molar mass of the material. In an example wherein the first barrier layer comprises $Al_XGaN_{(1-X)}$ and the second barrier layer comprises $Al_YGaN_{(1-Y)}$, the molar fraction of the second type III element in the second barrier layer is higher than a molar fraction of the second type III element in the first barrier layer if Y>X. In embodiments wherein the first and second barrier layers 120, 122 are each layers of AlGaN, the molar fraction of the second type III element is the aluminum content of the material. The aluminum content of the second barrier layer 122 may generally be in the range of 10% to 30%, and the aluminum content of the first barrier layer 120 may generally be in the range of 5% to 16%, wherein Y>X. Separately or in combination, the aluminum content of the second barrier layer 122 may be greater than the aluminum content of the first barrier layer 120 by at least 2%. This difference of 2% is an intentionally created difference that is outside any deviations that may occur from process variation between nominally identical values.

The inventors have observed that a simultaneous reduction in the thickness $T_2$ of the second barrier layer 122 and increase in the molar fraction of the second type III element in the central portion 124 of the semiconductor device between the gate structure 114 and the channel region 106 relative the first barrier layer 120, produces advantageous and unexpected results. All else being equal, reducing the thickness $T_2$ of the second barrier layer 122 reduces $ID_{SAT}$ and simultaneously increases $V_{TH}$. The decreased $ID_{SAT}$ occurs because the lower thickness $T_2$ of the second barrier reduces the density of the two-dimensional charge carrier gas 108 underneath the gate electrode 116. The increased $V_{TH}$ occurs because the region of doped III-V semiconductor material 118 is brought closer to the two-dimensional charge carrier gas 108 and has a stronger influence over the two-dimensional charge carrier gas 108. Conversely, all else being equal, increasing the molar fraction of the second type III element in the second barrier layer 122 increases $ID_{SAT}$ while simultaneously decreasing $V_{TH}$. The increased in $ID_{SAT}$ occurs because the higher molar fraction of the second type III element in the central portion 124 of the semiconductor device between the gate structure 114 and the channel region 106 increases the height of the energy barrier at the heterojunction and thus increases density of the two-dimensional charge carrier gas 108 underneath the gate electrode 116. The decreased $V_{TH}$ occurs because the higher molar fraction of the second type III element weakens the influence of the region of doped III-V semiconductor material 118. Advantageously and unexpectedly, the inventors have observed that these countervailing effects do not completely negate one another such that a beneficial improvement can be obtained. In particular, a relation exists wherein simultaneously reducing the thickness $T_2$ of the second barrier layer 122 and increasing the molar fraction of the second type III element in the second barrier layer 122 to maintain $V_{TH}$ at a fixed boundary condition, realizes a favorable improvement in $ID_{SAT}$. This relation can be ascertained for a given material parameters and utilized to select a thickness $T_2$ of the second barrier layer 122 and a molar fraction of the second type III element in the second barrier layer 122 with favorable or optimal $ID_{SAT}$. At least with respect to a second barrier layer 122 of AlGaN, the inventors have observed that the thickness $T_2$ of the second barrier layer 122 may be reduced down to about 10 nm and the aluminum content of the second barrier layer 122 may be increased up to about 30 percent with beneficial effect. Of course, there are limits to this concept at which other phenomena predominate, and these limits may be different depending on the particular material combinations and other aspects of the device. In any case, the concept is applicable to any of the material sets disclosed herein.

Due to the multi-layer configuration of the barrier region 104, the above-described simultaneous reduction in the thickness $T_2$ of the second barrier layer 122 and increase in the molar fraction of the second type III element can occur without substantially increasing the mechanical strain between the barrier region 104 and the channel region 106. Although an increased difference in molar fraction of the second type III element can create a disparity in lattice constant between the barrier region 104 and the channel region 106 and thus increase the mechanical strain, this mechanical strain is relegate to the gate region. In the outer later regions 126, the first barrier layer 120 has a lower molar fraction of the second type III element and thus induces less mechanical strain. Moreover, the increased thickness $T_1$ of the first barrier layer 120 increases the density of the two-dimensional charge carrier gas 108 in the outer later regions 126.

The following numerical working example illustrates a favorable tradeoff that may be obtained by simultaneously reducing the thickness $T_2$ of the second barrier layer 122 and increase in the molar fraction of the second type III element. In this example, the second barrier layer 122 is a layer of AlGaN and the first barrier layer 120 is a layer of AlGaN with a higher thickness $T_1$ and lower aluminum content as the first barrier layer 120. Under the boundary condition that $V_{TH}$ is to be maintained constant at approximately 1.4 V (volts), the thickness $T_2$ of the second barrier layer 122 is successively decreased while the concentration of aluminum is successively increased. In particular, the thickness $T_2$ of the second layer is 26 nm and the concentration of aluminum is 15% in a first iteration, the thickness $T_2$ of the second layer is 23 nm and the concentration of aluminum is 16% in a second iteration, the thickness $T_2$ of the second layer is 20 nm and the concentration of aluminum is 18% in a third iteration, the thickness $T_2$ of the second layer is 17 nm and the concentration of aluminum is 20% in a fourth iteration, and the thickness $T_2$ of the second layer is 14 nm and the concentration of aluminum is 22% in a fifth iteration. As between each iteration, a near linear improvement in $ID_{SAT}$ is observed without substantially altering $V_{TH}$. As between the first and fifth iteration, $ID_{SAT}$ is favorably increased by greater than about 20%. More generally, this technique may be used to tailor the thickness $T_2$ of the second barrier layer 122 and increase in the molar fraction of the second type III element for different material sets.

Figure 2:
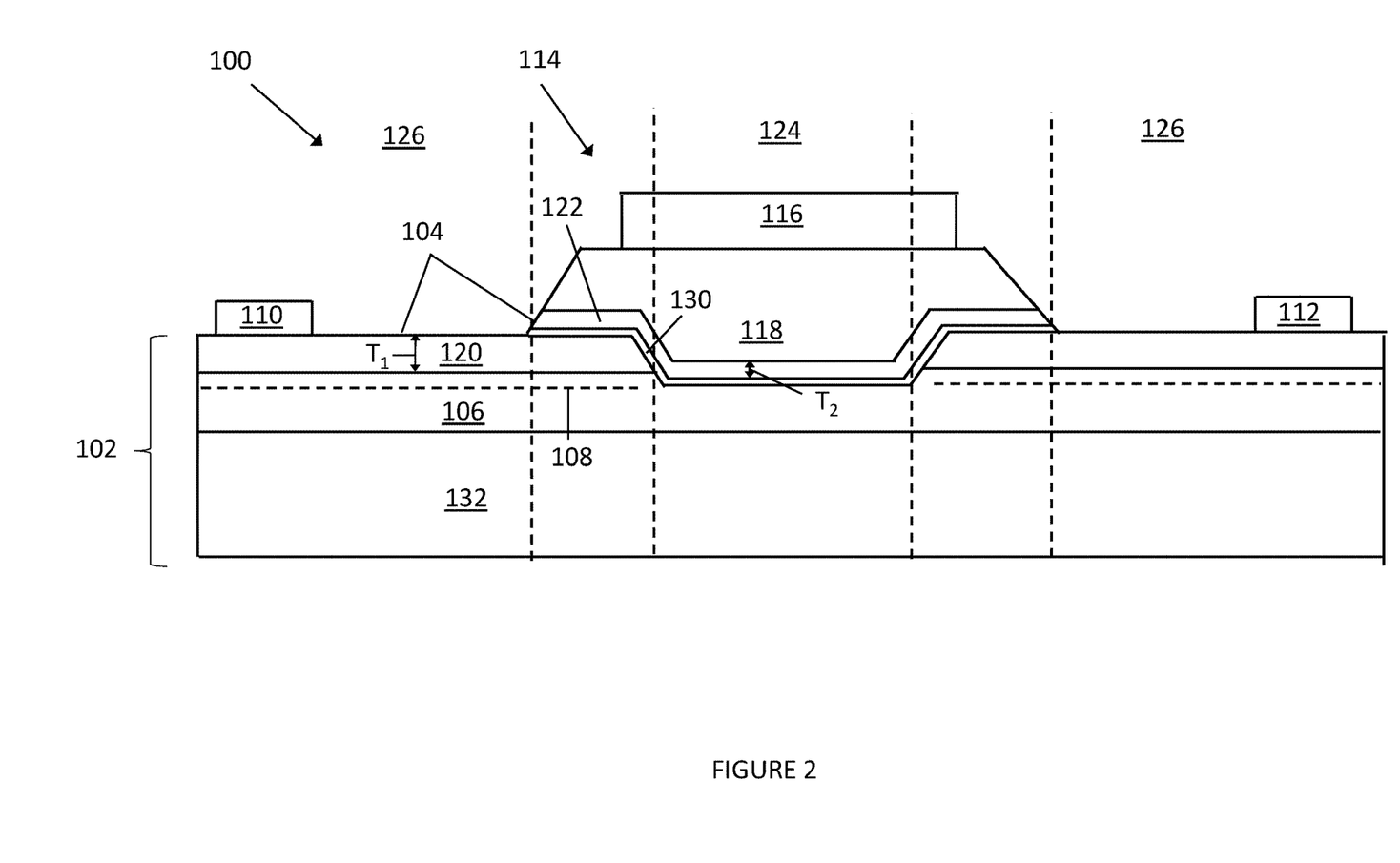
FIG. 2 illustrates a high-electron-mobility field effect transistor from a cross-sectional perspective, according to another embodiment.

Referring to FIG. 2, a high-electron mobility transistor 100 is depicted, according to another embodiment. The high-electron mobility transistor 100 of FIG. 2 comprises a third barrier layer 130 that is interposed between the second barrier layer 122 and the channel region 106 in the central portion 124 of the semiconductor device. The third barrier layer 130 comprises the second type III element that is present in the second barrier layer 122, e.g., aluminum in the above example. For example, the third barrier layer 130 can comprise AlN. Providing the third barrier layer 130 in the high-electron mobility transistor 100 represents another way to increase in the molar fraction of the second type III element in the central portion 124 of the semiconductor device between the gate structure 114 and the channel region 106. Thus, the advantageous improvements to $ID_{SAT}$ as discussed above can be realized by the incorporation of the third barrier layer 130. Generally speaking, the third barrier layer 130 can be between 1-5 nm thick. In one example wherein the thickness $T_2$ of the second layer is 16 nm, it was observed that providing a third barrier layer 130 of AlN that is 1.5 nm thick leads to an improvement in $ID_{SAT}$ of about 11% in comparison to a corresponding device that does not comprise the diffusion barrier layer. More generally, the material composition and thickness of the third barrier layer 130 represents another parameter that can be evaluated along with the thickness $T_2$ of the second barrier layer 122 and the molar fraction of the second type III element to ascertain increased or optimized $ID_{SAT}$ with a given $V_{TH}$ as a boundary condition. In an embodiment that comprises the third barrier layer 130, the molar fraction of the second type III element that is present in the second barrier layer 122 can be greater than in the first barrier layer 120 according to the embodiments described with reference to FIG. 1. Alternatively, the molar fraction of the second type III element that is present in the second barrier layer 122 can be the same as in the first barrier layer 120, as the increased molar fraction of the second type III element in the central portion 124 can be provided exclusively from third barrier layer 130.

Figure 3:
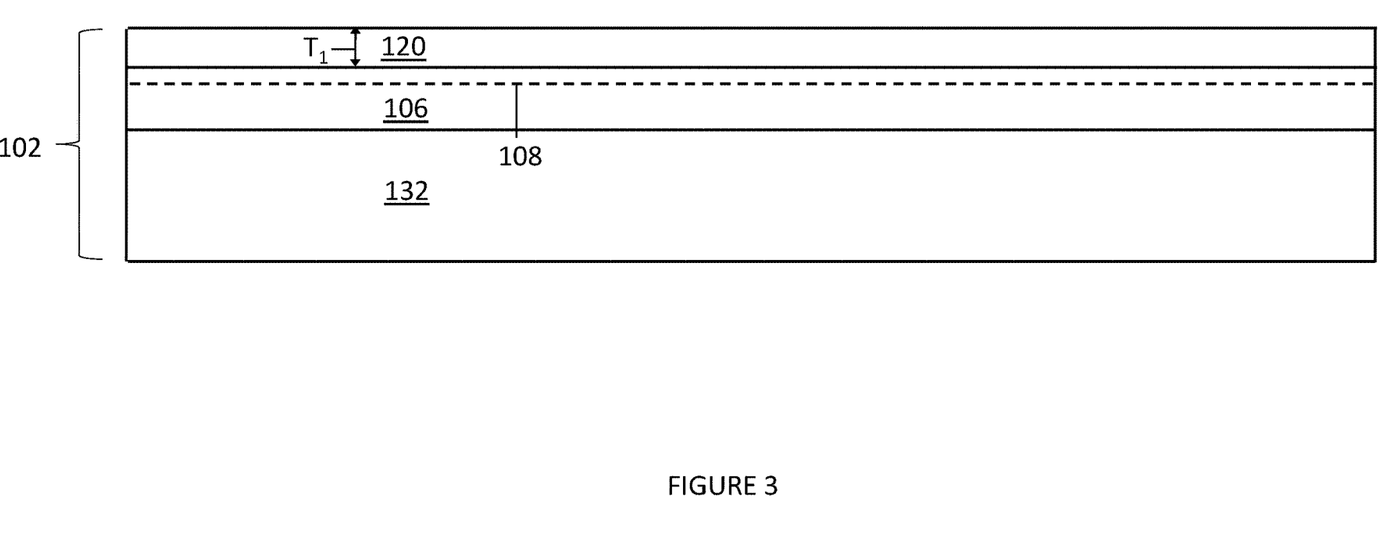
FIGS. 3-6 illustrate selected method steps for forming a high-electron-mobility field effect transistor from a cross-sectional perspective, according to an embodiment.

Referring to FIG. 3, a method of forming the high-electron mobility transistor 100 comprises providing a base substrate 132. The base substrate 132 may comprise III-V or type IV semiconductor material that is suitable for the epitaxially grow III-V semiconductor material thereon. For example, the base substrate 132 may be a commercially available bulk silicon wafer. A nucleation layer (not shown) may be provided on an upper surface of the base substrate 132 to facilitate the epitaxial growth of III-V semiconductor material thereon. This nucleation layer may be layer of AlN that is between 100 nm and 200 nm thick, for example. Before forming the channel region 106, one or more sub-channel layers or regions (not shown) may be formed. These sub-channel layers or regions may include lattice transition regions that are configured to alleviate mechanical stresses in the semiconductor substrate 102 resulting from lattice mismatch. Examples of these lattice transition regions include regions with multiple layers of III-V material with varying crystalline properties e.g., layers of GaN/AlGaN/AlN with different aluminum content. Additionally or alternatively, these sub-channel layers or regions may include back-barrier regions that are disposed underneath the channel region 106 and are configured to increase carrier confinement in the two-dimensional charge carrier gas 108. Examples of these back-barrier regions include regions of AlGaN, for example. After providing the base substrate 132 and forming any of the above described sub-channel layers (if applicable), the channel region 106 and the first barrier layer 120 may be formed by an epitaxial growth process, such as a physical vapor deposition process, for example. The thickness $T_1$ of the first barrier layer 120 and the molar fraction of the second type III element in the first barrier layer 120 can be selected to be conform to any of the values discussed herein through this epitaxial growth process.

Figure 4:
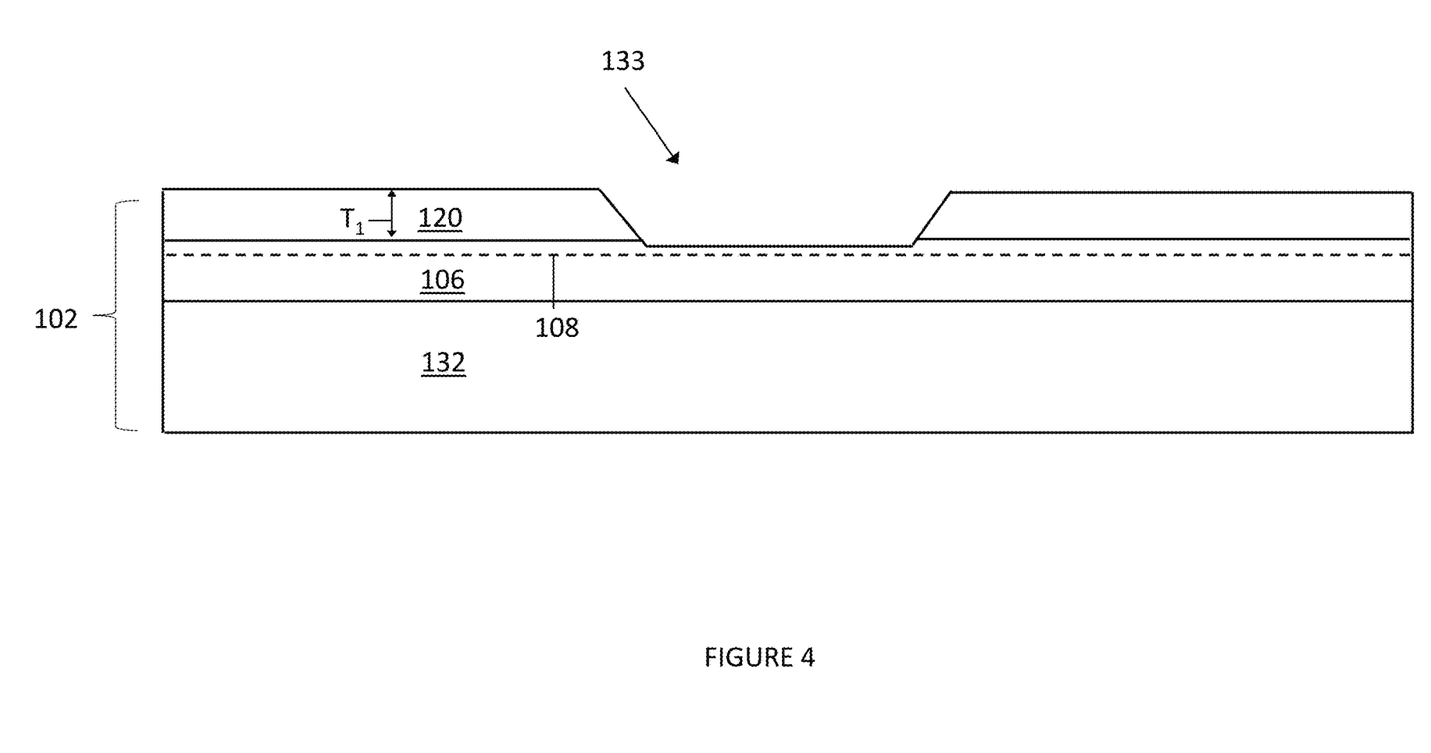

Referring to FIG. 4, a gate trench 133 is formed in the first barrier layer 120. The gate trench 133 may be formed using an etching technique, for example. According to this technique, a patterned mask (not shown) is provided on the upper surface of the first barrier layer 120. The patterned mask can be formed by a photolithography technique, for example. The substrate 102 is etched electively to the mask material such that a gate trench 133 extends into the first barrier layer 120 and an upper side of the channel region 106 is exposed. As shown, the etching process may be an isotropic process such that the sidewalls of the gate trench 133 are tapered.

Figure 5:
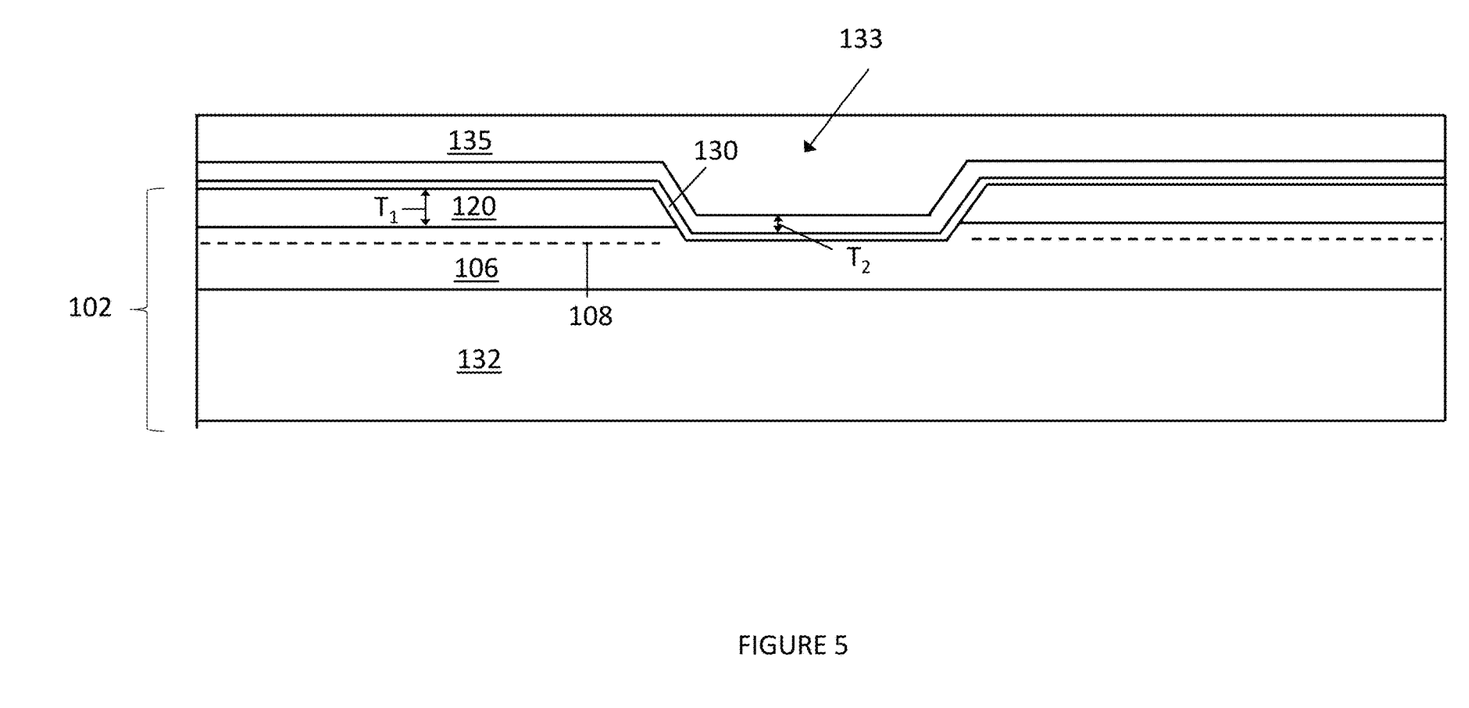

Referring to FIG. 5, a third barrier layer 130, a second barrier layer 122, and a layer of doped III-V semiconductor material 135 are formed. In an embodiment wherein the device does not comprise the third barrier layer 130, this layer can be omitted such that the second barrier layer 122 is formed directly on the first barrier layer 120. Each of the third barrier layer 130, the second barrier layer 122, and the layer of doped III-V semiconductor material 135 may be formed by an epitaxial growth process, such as a physical vapor deposition process. These epitaxial growth processes may be performed separately or together in one common process or chamber. The thickness and material composition of the third barrier layer 130, the thickness $T_2$ of the second barrier layer 122 and the molar fraction of the second type III element in the second barrier layer 122, and the thickness and material composition of the layer of doped III-V semiconductor material 135 can be selected to be conform to any of the values discussed herein by this epitaxial growth process. This represents one example of a technique whereby the second barrier layer 122 is a so-called regrown layer. According to these techniques, a first epitaxy process that forms the first barrier layer 120 on the channel region 106 is performed, e.g., as previously described with reference to FIG. 3. Subsequently and after forming the gate trench 133, a second epitaxy process the forms the second barrier layer 122 on the first barrier layer 120 and substantially conformally lines the gate trench 132 is performed, e.g., as described with reference to FIG. 5. In this way, independent control of the material parameters is possible.

Figure 6:
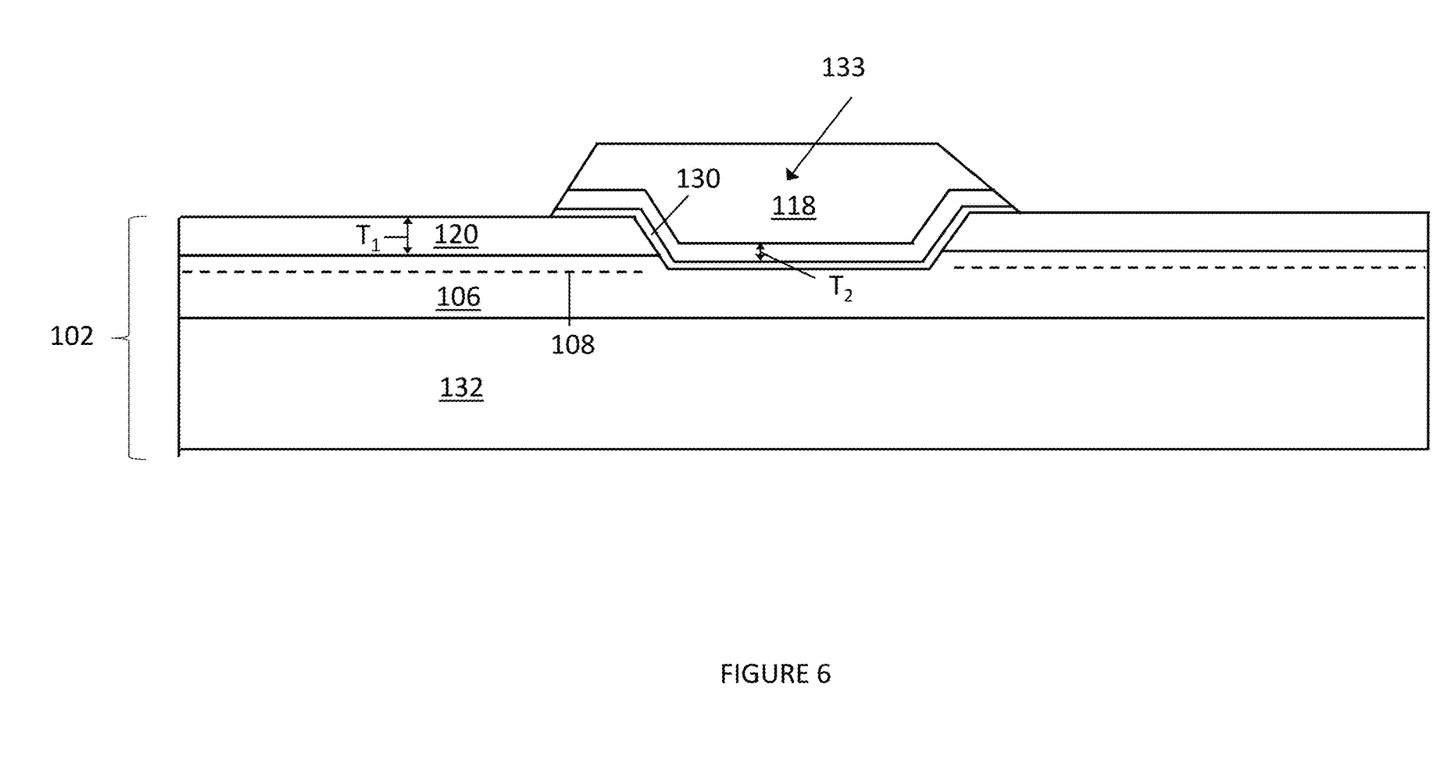

Referring to FIG. 6, the third barrier layer 130, the second barrier layer 122, and the layer of doped III-V semiconductor material 135 are structured to expose the upper surface of the first barrier layer 120 from these layers. This may be done using one or more masked etching steps, for example. Subsequently, the source, drain and gate electrodes 110, 112, 116 may be formed by metal deposition and etching techniques, followed by deposition of any passivation or interlayer dielectric layers.

As used herein, the phrase "III-V semiconductor material" refers to a compound material that includes at least one Group III element, such as aluminum (Al), gallium (Ga), indium (In), and boron (B) and at least one Group IV element, such as nitrogen (N), phosphorous (P), and arsenic (As), and including but not limited to any of its alloys, such as aluminum gallium nitride (AlxGa(1-x)N), indium gallium nitride (InyGa(1-y)N), aluminum indium gallium nitride (AlxInyGa(1-x-y)N), gallium arsenide phosphide nitride (GaAsaPbN(1-a-b)), and aluminum indium gallium arsenide phosphide nitride (AlxInyGa(1-x-y)AsaPbN(1-a-b)), for example. Aluminum gallium nitride and AlGaN refers to an alloy described by the formula AlxGa(1-x)N, where 0<x<1.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-V based compound semiconductor transistor incorporating a junction between two materials with different band gaps (i.e., a heterojunction) as the channel.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a semiconductor substrate comprising a barrier region of III-V semiconductor material and a channel region of III-V semiconductor material disposed below the barrier region, the barrier region forming a heterojunction with the channel region such that a two-dimensional charge carrier gas is disposed in the channel region near the heterojunction;
   source and drain electrodes that are each in ohmic contact with the two-dimensional charge carrier gas; and
   a gate structure that is configured to control a conductive connection between the source and drain electrodes,
   wherein the barrier region comprises a first barrier layer and a second barrier layer,
   wherein in a central portion of the semiconductor device that overlaps with the gate structure the second barrier layer is the only one of the first and second barrier layers that is disposed over the channel region,
   wherein in outer lateral portions of the semiconductor device that are disposed on either side of the central portion the first barrier layer is disposed over the channel region,
   wherein the first and second barrier layers are each III-V semiconductor alloys comprising a first type III element and a second type III element, and
   wherein a molar fraction of the second type III element in the central portion of the semiconductor device between the gate structure and the channel region is higher than in the first barrier layer.

2. The semiconductor device of claim 1, wherein the first barrier layer comprises an opening that is disposed in the central portion of the semiconductor device, and wherein the second barrier layer substantially conformally lines the opening.

3. The semiconductor device of claim 2, wherein the gate structure comprises a gate electrode and a region of doped III-V semiconductor material disposed between the gate electrode and the barrier region, wherein the region of doped III-V semiconductor material is configured to deplete the two-dimensional charge carrier gas in an off-state of the semiconductor device, and wherein in the central portion the second barrier layer is the only one of the first and second barrier layers that is that is disposed between the region of doped III-V semiconductor material and the channel region.

4. The semiconductor device of claim 3, wherein in the outer lateral portions of the semiconductor device an upper surface of the first barrier layer is exposed from the second barrier layer.

5. The semiconductor device of claim 3, wherein the second barrier layer directly interfaces with the channel region in the central portion of the semiconductor device.

6. The semiconductor device of claim 3, further comprising a third barrier layer that is interposed between the second barrier layer and the channel region in the central portion of the semiconductor device, wherein the third barrier layer comprises the second type III element.

7. The semiconductor device of claim 1, wherein a thickness of the second barrier layer is less than a thickness of the first barrier layer.

8. The semiconductor device of claim 7, wherein the thickness of the second barrier layer is less than one half of the thickness of the first barrier layer.

9. The semiconductor device of claim 1, wherein the molar fraction of the second type III element in the second barrier layer is higher than the molar fraction of the second type III element in the first barrier layer by at least two percent.

10. A semiconductor device, comprising:
    a semiconductor substrate comprising a barrier region of AlGaN semiconductor material and a channel region of GaN or AlGaN disposed below the barrier region, the barrier region forming a heterojunction with the channel region such that a two-dimensional charge carrier gas is disposed in the channel region near the heterojunction;
    source and drain electrodes that are each in ohmic contact with the two-dimensional charge carrier gas; and
    a gate structure that is configured to control a conductive connection between the source and drain electrodes, wherein the barrier region comprises a first barrier layer and a second barrier layer, wherein in a central portion of the semiconductor device that overlaps with the gate structure the second barrier layer is the only one of the first and second barrier layers that is disposed over the channel region, wherein in outer lateral portions of the semiconductor device that are disposed on either side of the central portion the first barrier layer is disposed over the channel region, wherein the first and second barrier layers are each layers of AlGaN, and wherein the aluminum content of the semiconductor device in the central portion of the semiconductor device between the gate structure and the channel region is higher than the aluminum content of the first barrier layer.

11. The semiconductor device of claim 10, wherein a thickness of the second barrier layer is less than or equal to one half of the thickness of the first barrier layer.

12. The semiconductor device of claim 10, wherein the aluminum content of the second barrier layer is higher than the aluminum content of the first barrier layer by at least two percent.

13. The semiconductor device of claim 12, wherein the aluminum content of the second barrier layer is between 15% and 40%, wherein the aluminum content of the first barrier layer is between 5% and 25%, wherein a thickness of the second barrier layer is between 30 nm and 5 nm, wherein a thickness of the first barrier layer is between 100 nm and 15 nm, and wherein the thickness of the second barrier layer is less than or equal to one half of the thickness of the first barrier layer.

14. The semiconductor device of claim 13, further comprising a third barrier layer that is interposed between the second barrier layer and the channel region in the central portion of the semiconductor device, wherein the third barrier layer is a layer of aluminum nitride.

15. A method of forming a semiconductor device, the method comprising:
providing a semiconductor substrate comprising a barrier region of III-V semiconductor material and a channel region of III-V semiconductor material disposed below the barrier region, the barrier region forming a heterojunction with the channel region such that a two-dimensional charge carrier gas is disposed in the channel region near the heterojunction;
forming a source and drain electrodes that are each in ohmic contact with the two-dimensional charge carrier gas; and
forming a gate structure that is configured to control a conductive connection between the source and drain electrodes,
wherein the barrier region comprises a first barrier layer and a second barrier layer,
wherein in a central portion of the semiconductor device that overlaps with the gate structure the second barrier layer is the only one of the first and second barrier layers that is disposed over the channel region,
wherein in outer lateral portions of the semiconductor device that are disposed on either side of the central portion the first barrier layer is disposed over the channel region,
wherein the first and second barrier layers are each III-V semiconductor alloys comprising a first type III element and a second type III element, and
wherein a molar fraction of the second type III element in the central portion of the semiconductor device between the gate structure and the channel region is higher than in the first barrier layer.

16. The method of claim 15, further comprising:
performing a first epitaxy process that forms the first barrier layer on the channel region;
forming a gate trench in the first barrier layer that extends to the channel region; and
performing a second epitaxy process that forms the second barrier layer on the first barrier layer and substantially conformally lines the gate trench.

17. The method of claim 16, wherein forming the gate structure comprises forming a gate electrode and a region of doped III-V semiconductor material disposed between the gate electrode and the barrier region, wherein the region of doped III-V semiconductor material is configured to deplete the two-dimensional charge carrier gas in an off-state of the semiconductor device, and wherein in the central portion the second barrier layer is the only one of the first and second barrier layers that is disposed between the region of doped III-V semiconductor material and the channel region.

18. The method of claim 17, further comprising forming a third barrier layer that is interposed between the second barrier layer and the channel region in the central portion of the semiconductor device, wherein the third barrier layer comprises the second type III element.

19. The semiconductor device of claim 15, wherein a thickness of the second barrier layer is less than one half of a thickness of the first barrier layer.

20. The semiconductor device of claim 15, wherein the molar fraction of the second type III element in the second barrier layer is higher than the molar fraction of the second type III element in the first barrier layer by at least two percent.

* * * * *

UNITED STATES PATENT AND TRADEMARK OFFICE
CERTIFICATE OF CORRECTION

| | |
|---|---|
| PATENT NO. | : 12,183,816 B2 |
| APPLICATION NO. | : 17/458827 |
| DATED | : December 31, 2024 |
| INVENTOR(S) | : K. Reiser et al. |

Page 1 of 1

It is certified that error appears in the above-identified patent and that said Letters Patent is hereby corrected as shown below:

In the Claims

Column 14, Line 43 (Claim 19, Line 1) please change "The semiconductor device of" to -- The method of --

Column 14, Line 46 (Claim 20, Line 1) please change "The semiconductor device of" to -- The method of --

Signed and Sealed this
Eighteenth Day of February, 2025

Coke Morgan Stewart
*Acting Director of the United States Patent and Trademark Office*